(12) United States Patent
Kim et al.

(10) Patent No.: US 11,348,966 B2
(45) Date of Patent: May 31, 2022

(54) DISPLAY DEVICE AND METHOD FOR MANUFACTURING SAME

(71) Applicant: Samsung Display Co., Ltd., Yongin-Si (KR)

(72) Inventors: Hyunae Kim, Seoul (KR); Youngdae Kim, Seoul (KR); Cha-dong Kim, Seoul (KR); Chongsup Chang, Hwaseong-si (KR); Euikang Heo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 78 days.

(21) Appl. No.: 16/576,705

(22) Filed: Sep. 19, 2019

(65) Prior Publication Data

US 2020/0168662 A1 May 28, 2020

(30) Foreign Application Priority Data

Nov. 22, 2018 (KR) ........................ 10-2018-0145377

(51) Int. Cl.
*H01L 27/15* (2006.01)
*H01L 33/62* (2010.01)
*H01L 27/12* (2006.01)

(52) U.S. Cl.
CPC .......... *H01L 27/156* (2013.01); *H01L 27/124* (2013.01); *H01L 27/1248* (2013.01);
(Continued)

(58) Field of Classification Search
CPC ... H01L 27/156; H01L 33/62; H01L 27/1248; H01L 27/124; H01L 27/1255; H01L 27/1259; H01L 33/507; H01L 33/486; H01L 25/167; H01L 33/20; H01L 33/385; H01L 33/60; H01L 29/78633; H01L 33/32; H01L 33/06; H01L 33/0075; H01L 25/0753; G09G 3/3225; G06F 3/042; G06F 3/0412; H05K 1/181; H05K 1/11

USPC ............... 257/13, 99, 98, E33.001, E33.058, 257/E33.062, E33.005; 438/34, 28; 315/250

See application file for complete search history.

(56) References Cited

U.S. PATENT DOCUMENTS 9,190,590 B2 11/2015 Shibata et al.
2013/0341588 A1* 12/2013 Jeon ........................ G02F 1/174
257/13

(Continued)

FOREIGN PATENT DOCUMENTS

KR 10-2015-0098246 A 8/2015
KR 10-1713818 B1 3/2017
(Continued)

*Primary Examiner* — Mouloucoulaye Inoussa
(74) *Attorney, Agent, or Firm* — Lewis Roca Rothgerber Christie LLP

(57) ABSTRACT

Provided is a display device including a substrate, a first electrode disposed on the substrate, a second electrode disposed on the substrate and spaced apart from the first electrode, a plurality of first sub-insulating layers extending in a first direction, disposed on the substrate and on the first and second electrodes, and arranged in a second direction crossing the first direction, and a plurality of light emitting elements disposed between the first sub-insulating layers and electrically connected to the first electrode and the second electrode.

15 Claims, 17 Drawing Sheets

(52) U.S. Cl.
CPC .......... *H01L 33/62* (2013.01); *H01L 27/1255* (2013.01); *H01L 27/1259* (2013.01); *H01L 2933/0066* (2013.01)

(56) References Cited

U.S. PATENT DOCUMENTS

| | | | |
|---|---|---|---|
| 2014/0159064 A1* | 6/2014 | Sakariya | H01L 33/60 257/88 |
| 2015/0331285 A1* | 11/2015 | Bibi | H01L 25/167 362/84 |
| 2016/0148911 A1* | 5/2016 | Do | H01L 33/62 257/88 |
| 2017/0062674 A1* | 3/2017 | Kwon | H01L 25/0753 |
| 2018/0012876 A1 | 1/2018 | Kim et al. | |
| 2018/0019369 A1* | 1/2018 | Cho | H01L 33/405 |
| 2018/0019426 A1 | 1/2018 | Im et al. | |
| 2018/0175104 A1* | 6/2018 | Kang | H01L 33/405 |
| 2018/0287010 A1 | 10/2018 | Sung | |
| 2019/0096858 A1* | 3/2019 | Woo | H01L 25/0753 |
| 2019/0115513 A1* | 4/2019 | Im | H01L 33/20 |

FOREIGN PATENT DOCUMENTS

| | | |
|---|---|---|
| KR | 10-2018-0007025 A | 1/2018 |
| KR | 10-2018-0007376 A | 1/2018 |
| KR | 10-2018-0009015 A | 1/2018 |
| WO | 2020017746 A1 | 1/2020 |

* cited by examiner

DISPLAY DEVICE AND METHOD FOR MANUFACTURING SAME

CROSS-REFERENCE TO RELATED APPLICATIONS

This U.S. non-provisional patent application claims priority under 35 U.S.C. § 119 of Korean Patent Application No. 10-2018-0145377, filed on Nov. 22, 2018, the entire contents of which are hereby incorporated by reference.

BACKGROUND

The present disclosure herein relates to a display device and a method for manufacturing the same, and more particularly, to a display device that is capable of improving the degree of alignment and contact areas of light emitting elements and a method for manufacturing the display device.

In general, display devices include pixels for displaying an image. Various types of pixels, such as pixels including a liquid crystal layer, pixels including an electrowetting layer, pixels including an electrophoresis layer, and pixels including light emitting elements, are used to display an image. Among these types, the light emitting elements are self light emitting elements, and do not require separate light sources.

Recently, an ultra-small LED element has been developed as a light emitting element. The ultra-small element is manufactured in units of nanometer or micrometer, and has a columnar or cylindrical shape. These ultra-small LED elements are horizontally arranged and electrically connected to a first electrode or a second electrode which have polarities opposite to each other. Voltages with polarities opposite to each other are applied to the first electrode and the second electrode, so that a plurality of ultra-small LED elements are arranged toward the first electrode and the second electrode by electric fields formed in the first electrode and the second electrode.

In order to improve contact areas between the first and second electrodes and the ultra-small elements, contact electrodes are arranged on the first electrode and the second electrode so as to cover the ultra-small LED elements. However, the contact electrodes may not normally contact the lower portions of the ultra-small LED elements having cylindrical shapes.

SUMMARY

The present disclosure provides a display device and a method for manufacturing the same which are capable of improving the degree of alignment and contact areas of light emitting elements.

An embodiment of the inventive concept provides a display device including a substrate, a first electrode disposed on the substrate, a second electrode disposed on the substrate and spaced apart from the first electrode, a plurality of first sub-insulating layers extending in a first direction, disposed on the substrate and on the first and second electrodes, and arranged in a second direction crossing the first direction, and a plurality of light emitting elements disposed between the first sub-insulating layers and electrically connected to the first electrode and the second electrode.

The display device may have wherein with respect to a third direction perpendicular to a plane defined by the first and second directions, each of the light emitting elements has a first thickness, and each of the first sub-insulating layers has a second thickness smaller than the first thickness.

The display device may have wherein the second thickness has a value of 0.3 times to 0.5 times the first thickness.

The display device may have wherein with respect to the second direction, the light emitting element has a first width, and a first gap between an h-th first sub-insulating layer and an h-th light emitting element and a second gap between an (h+1)-th first sub-insulating layer and the h-th light emitting element are smaller than the first width (h is an integer).

The display device may have wherein each of the first and second gaps has a value of 0.15 times to 0.25 times the first width.

The display device may have wherein the first and second electrodes extend in the second direction, the light emitting elements extend in the first direction, and both sides of each of the light emitting elements are respectively disposed on the first electrode and the second electrode.

The display device may have wherein the first sub-insulating layers are arranged at regular intervals in the second direction.

The display device may further comprise: a first contact electrode extending in the second direction, disposed on the first electrode and on portions of the first sub-insulating layers overlapping the first electrode, and configured to cover one sides of the light emitting elements; and a second contact electrode extending in the second direction, disposed on the second electrode and on portions of the first sub-insulating layers overlapping the second electrode, and configured to cover the other sides of the light emitting elements.

The display device of may have wherein the first sub-insulating layers comprise an inorganic material.

The display device of may further comprise: a first partition wall layer disposed between the substrate and the first electrode; and a second partition wall layer disposed between the substrate and the second electrode, wherein the light emitting elements are disposed between the first partition wall layer and the second partition wall layer.

The display device may further comprise: a plurality of second sub-insulating layers disposed between the light emitting elements and the first sub-insulating layers, wherein with respect to a third direction crossing a plane defined by the first and second directions, a thickness of each of the second sub-insulating layers is smaller than a thickness of each of the first sub-insulating layers.

The display device may have wherein the second sub-insulating layers comprise an organic material. In an embodiment of the inventive concept, a method for manufacturing a display device includes: providing, on a substrate, a first electrode and a second electrode which are spaced apart from each other; providing an insulating layer on the substrate so as to cover the first electrode and the second electrode; removing first portions of the insulating layer to form a plurality of first sub-insulating layers extending in a first direction and arranged in a second direction crossing the first direction; and providing a plurality of light emitting elements between the first sub-insulating layers and to electrically connect the light emitting elements to the first electrode and the second electrode.

The method may have wherein the forming of the first sub-insulating layers comprises: providing, on the insulating layer, a photoresist pattern configured to expose the first portions; and removing the first portions exposed by the photoresist pattern to form the first sub-insulating layers.

The method may have wherein with respect to a third direction perpendicular to a plane defined by the first and second directions, each of the light emitting elements has a first thickness, and each of the first sub-insulating layers has a second thickness smaller than the first thickness.

The method may have wherein with respect to the second direction, the light emitting element has a first width, and a first gap between an h-th first sub-insulating layer and an h-th light emitting element and a second gap between an (h+1)-th first sub-insulating layer and the h-th light emitting element are smaller than the first width (h is an integer).

The method may have wherein the first and second electrodes extend in the second direction, the light emitting elements extend in the first direction, and both sides of each of the light emitting elements are respectively disposed on the first electrode and the second electrode.

The method may further comprise: providing, on the first electrode, a first contact electrode extending in the second direction and configured to cover one sides of the light emitting elements; and providing, on the second electrode, a second contact electrode extending in the second direction and configured to cover the other sides of the light emitting elements.

The method may have wherein the first sub-insulating layers comprise an inorganic material.

The method may further comprise: providing a first partition wall layer between the substrate and the first electrode; and providing a second partition wall layer disposed between the substrate and the second electrode, wherein the light emitting elements are disposed between the first partition wall layer and the second partition wall layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

In this specification, it will be meant that when an element (or region, layer, portion, etc.) is referred to as being "on", "connected to" or "coupled to" another element, it may be directly on, connected or coupled to the other element or a third elements may be interposed therebetween.

Like reference numbers refer to like elements. Also, in the figures, the dimensions of layers and regions are exaggerated for clarity of illustration.

The term "and/or" includes any of one or more combinations that may be defined by the associated listed items.

It will be understood that although the terms of first and second are used herein to describe various elements, these elements should not be limited by these terms. The above terms are only used to distinguish one component from other components. For example, a first element may be referred to as a second element and the second element may also be referred to as the first element without departing from the spirit and scope of the inventive concept. The terms of a singular form may include plural forms unless clearly referred to the contrary.

In addition, terms such as "under", "below", "on", "above" and the like may be used herein to describe relationships between the elements illustrated in figures. The above terms are relative concepts, and described with respect to the direction indicated in figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be understood that in the specification, the meaning of 'include' or 'have' specifies a property, a numeral, a step, an operation, an element or a combination thereof, but does not exclude other properties, numerals, steps, operations, elements or combinations thereof.

Hereinafter, exemplary embodiments of the inventive concept will be described in detail with reference to the accompanying drawings.

Figure 1:
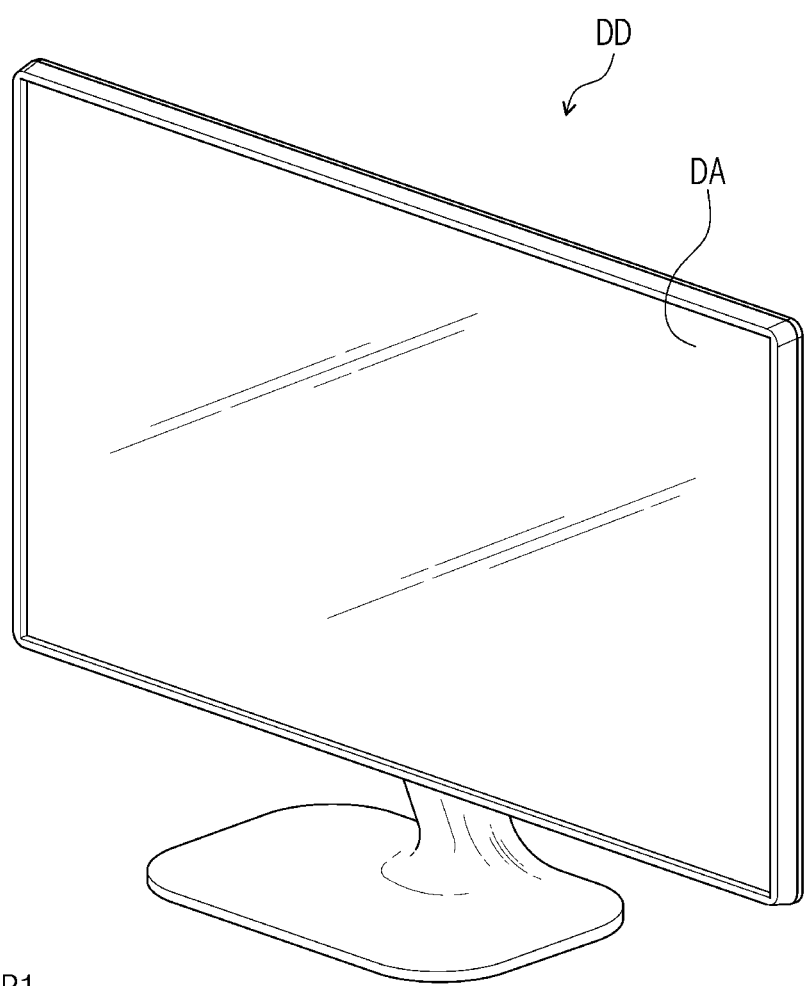
FIG. 1 is a perspective view of a display device according to an embodiment of the inventive concept.
Figure 1:
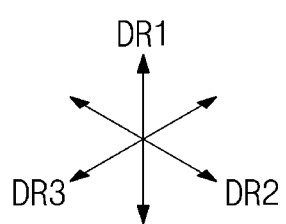

FIG. 1 is a perspective view of a display device according to an embodiment of the inventive concept.

Referring to FIG. 1, a display device DD may display an image through a display region DA. The display region DA may have a plane defined by a first direction DR1 and a second direction DR2 crossing the first direction DR1. However, the present inventive concept is not limited thereto, and the display region of the display device DD may have a curved surface.

Hereinafter, a direction substantially perpendicularly crossing the plane defined by the first and second directions DR1 and DR2 is defined as a third direction DR3. The first, second, and third directions DR1, DR2 and DR3 are relative concepts, and may be converted into other directions.

FIG. 1 exemplarily illustrates that the display device DD is a television. However, the present inventive concept is not limited thereto, and the display device DD may be used for large-sized electronic devices such as televisions, monitors, or external advertisement boards, and also be used for small and medium-sized electronic devices, such as personal computers, laptop computers, personal digital terminals, car navigation units, game machines, smartphones, tablets, and cameras. However, these are provided merely as examples, and of course, the display device DD may also be used for other electronic devices.

Figure 2:
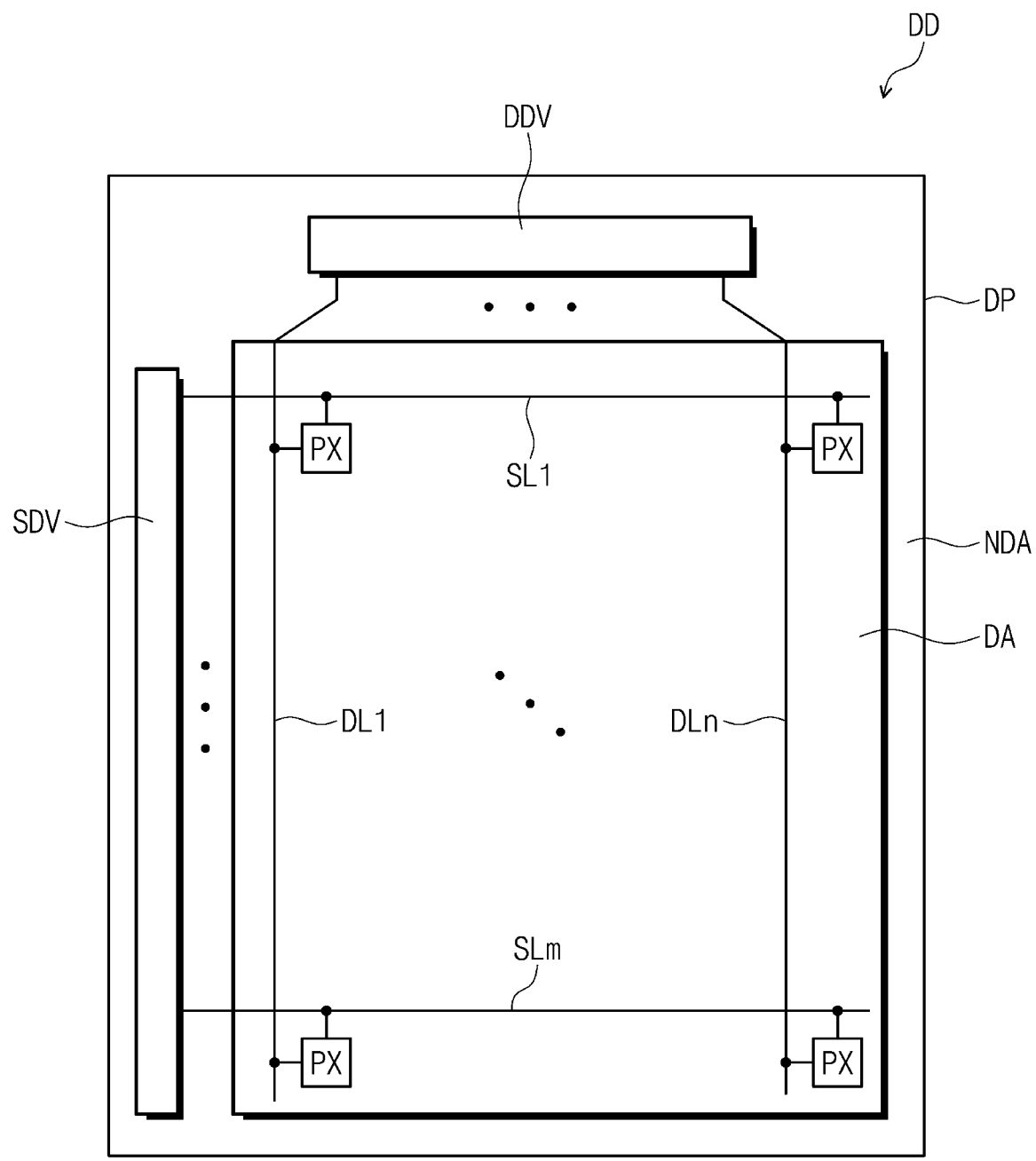
FIG. 2 is a plan view of the display device illustrated in FIG. 1.

FIG. 2 is a plan view of the display device DD illustrated in FIG. 1.

Referring to FIG. 2, a display device DD according to an embodiment of the inventive concept may include a display panel DP, a scan driver SDV, and a data driver DDV. The scan driver SDV and the data driver DDV may be disposed on the display panel DP.

The display panel DP may have a rectangular shape having short sides in the first direction DR1 and long sides in the second direction DR2 crossing the first direction DR1. However, the present inventive concept is not limited thereto, and the shape of the display panel DP may have various shapes such as circles or polygons.

The display panel DP may include a display region DA and a non-display region NDA surrounding the display region DA. The display region DA may be a region which displays an image and the non-display region NDA may be a region which does not display any image.

The display panel DP may include a plurality of pixels PX, a plurality of scan lines SL1 to SLm, and a plurality of data lines DL1 to DLn, where m and n are natural numbers. The pixels may exemplarily be arranged in a matrix shape, but the arrangement shape of the pixels is not limited thereto.

The pixels PX may be disposed in the display region DA and be connected to the scan lines SL1 to SLm and the data lines DL1 to DLn. Each of the pixels PX may include a light emitting element for displaying an image.

The scan driver SDV and the data driver DDV may be disposed in the non-display region NDA. The scan driver SDV may be disposed in the non-display region NDA adjacent to any one long side among the long sides of the display panel DP. The data driver SDV may be disposed in the non-display region NDA adjacent to any one short side among the short sides of the display panel DP.

The scan lines SL1 to SLm may extend in the first direction DR1 and be connected to the scan driver SDV. The data lines DL1 to DLn may extend in the second direction DR2 and be connected to the data driver DDV.

The scan driver SDV may generate a plurality of scan signals and the scan signals may be applied to the pixels PX through the scan lines SL1 to SLm. The scan signals may sequentially be applied to the pixels PX. The data driver DDV may generate a plurality of data voltages and the data voltages may be applied to the pixels PX through the data lines DL1 to DLn.

Although not shown, the display device DD may include a timing controller for controlling the operations of the scan driver SDV and the data driver DDV. The timing controller may respond to control signals received from the outside and generate a scan control signal and a data control signal. The timing controller may receive image signals from the outside, convert the data format of the image signals so as to conform to an interface specification with the data driver DDV, and provide the image signals to the data driver DDV.

The scan driver SDV may respond to the scan control signal and generate the scan signals. The data driver DDV may receive image signals having converted data format and respond to the data control signal to generate data voltages corresponding to the image signals.

The pixels PX may respond to the scan signals and receive the data voltages. The pixels PX may emit light having brightness corresponding to the data voltages and thereby display an image.

Figure 3:
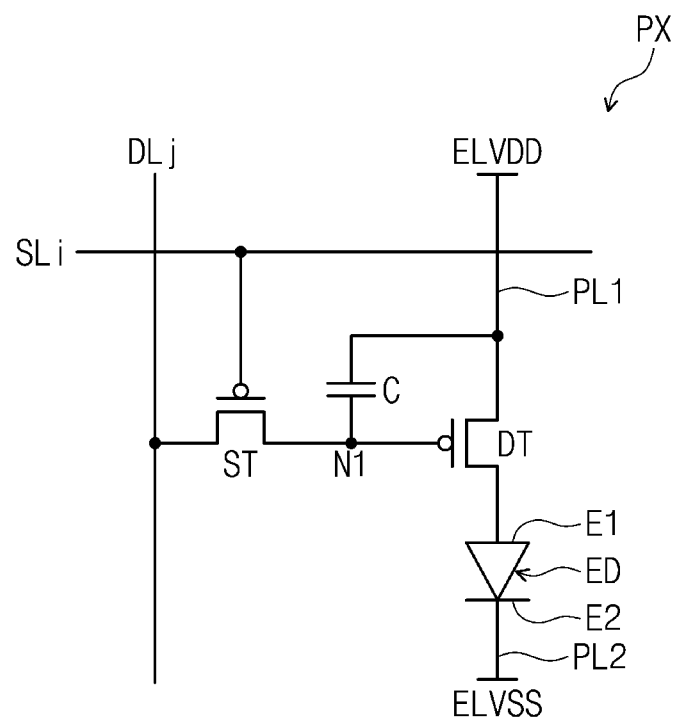
FIG. 3 is an equivalent circuit diagram of one pixel illustrated in FIG. 2.

FIG. 3 is an equivalent circuit diagram of one pixel illustrated in FIG. 2.

FIG. 3 illustrates an equivalent circuit diagram of one pixel PX among the pixels shown in FIG. 2, but other pixels PX illustrated in FIG. 2 may have the same equivalent circuit diagram as the pixel PX illustrated in FIG. 3. FIG. 3 exemplarily illustrates the pixel PX connected to a scan line SLi and a data line DLj, where i and j are natural numbers.

Referring to FIG. 3, the pixel PX may include a light emitting element ED, a drive element DT, a capacitive element C, and a switching element ST. The light emitting element ED may be provided in plurality. The plurality of light emitting elements ED will be illustrated in FIG. 4 below.

The drive element DT and the switching element ST may be P-type transistors. However, the present inventive concept is not limited thereto, and the drive element DT and the switching element ST may be N-type transistors. The capacitive element C may be a capacitor and include a first cap electrode (not shown) and a second cap electrode (not shown) which face each other.

The drive element DT may include: an input terminal connected to the first cap electrode of the capacitive element C and a first power supply line PL1; an output terminal connected to the light emitting element ED; and a control terminal connected to an output terminal of the switching element ST. The drive element DT may receive a first power supply voltage ELVDD through the first power supply line PL1. The second cap electrode of the capacitive element C may be connected to the control terminal of the drive element DT.

The switching element ST may include: an input terminal connected to the data line DLj; an output terminal connected to the control terminal of the drive element DT; and a control terminal connected to the scan line SLi.

The light emitting element ED may be connected to the drive element DT and a second power supply line PL2. For example, the light emitting element ED may be connected to a first electrode E1 connected to the drive element DT and to a second electrode E2 connected to the second power supply line PL2. The light emitting element ED may receive a second power supply voltage ELVSS through the second power supply line PL2. The second power supply voltage ELVSS may have a lower voltage level than the first power supply voltage ELVDD.

A scan signal may be applied to the control terminal of the switching element ST through the scan line SLi, and the switching element ST may respond to the scan signal to be turned on. The turned-on switching element ST may provide a first node N1 with the data voltage received through the data line DLj.

The capacitive element C may charge a charge quantity corresponding to the difference between the data voltage supplied to the first node N1 and the first power supply voltage ELVDD, and maintain the charge quantity even after the switching element ST is turned off.

The drive element DT may be turned on according to the charge quantity charged to the capacitive element C. According to the charge quantity charged to the capacitive element C, the turn-on time of the drive element DT may be determined. Current is supplied to the light emitting element ED through the turned on drive element DT, and thus, the light emitting element ED may emit light. The light emitting element ED emits light, so that an image may be generated.

The light emitting element ED may be an ultra-small LED element. The ultra-small LED element may be an LED element having a length of several nanometers to several hundred micrometers. The length of the ultra-small LED element is illustrated as merely an example, and the length of the ultra-small LED element is not limited to the above numerical range.

Figure 4:
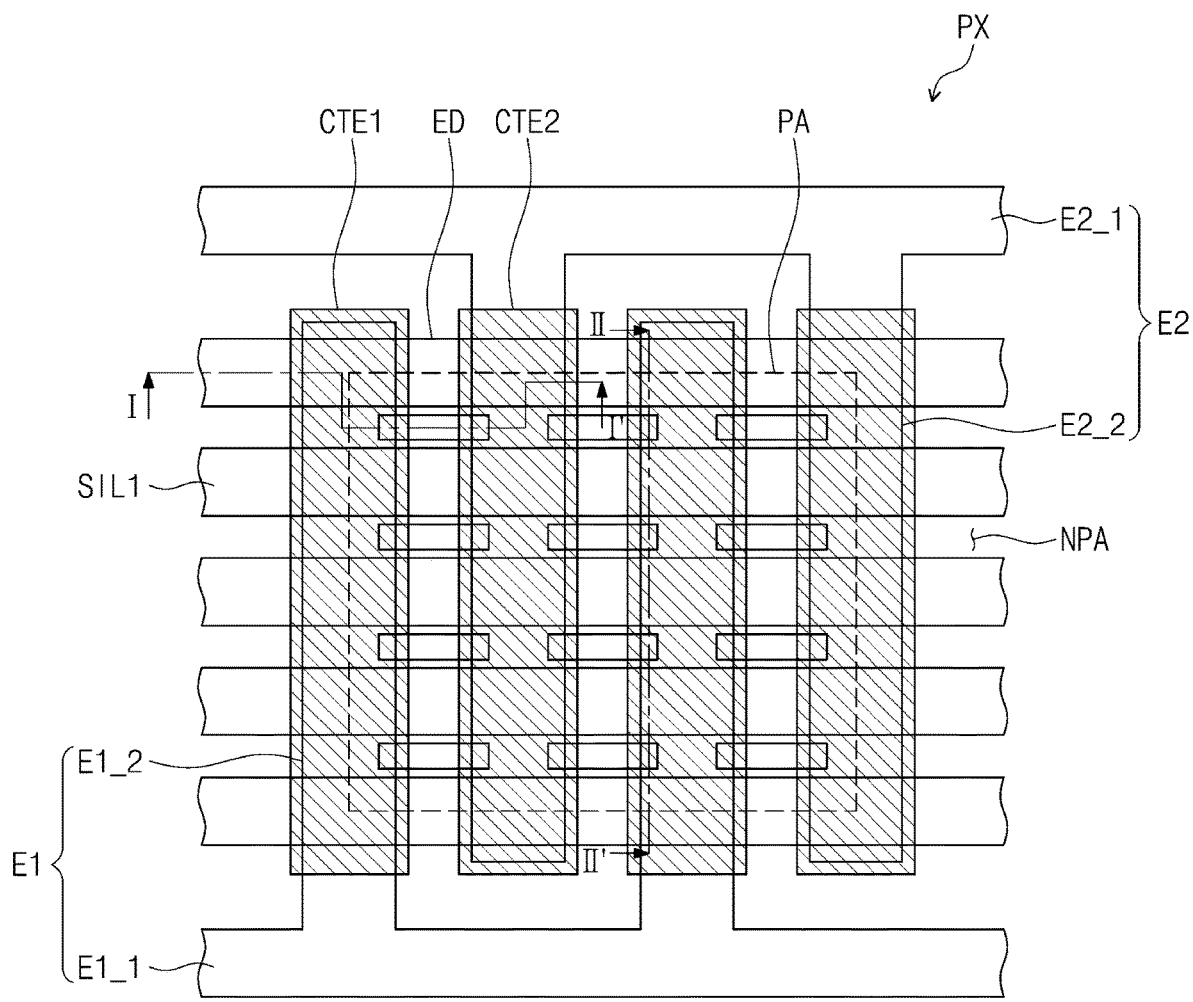
FIG. 4 is a plan view of a first electrode and a second electrode which are connected to a light emitting element illustrated in FIG. 3.

FIG. 4 is a plan view of a first electrode and a second electrode connected to the light emitting element illustrated in FIG. 3.

Referring to FIG. 4, a first electrode E1 may include: a first extension part E1_1 extending in the first direction DR1; and a plurality of first branch parts E1_2 branching in the second direction DR2 from the first extension part E1_1. The two first branch parts E1_2 are exemplarily illustrated, but the number of the first branch parts E1_2 is not limited thereto.

The second electrode E2 may include: a second extension part E2_1 extending in the first direction DR1; and second branch parts E2_2 branching in the second direction from the second extension part E2_1. Two second branch parts E2_2 are exemplarily illustrated, but the number of the second branch parts E2_2 is not limited thereto. The first branch parts E1_2 and the second branch parts E2_2 may be alternately disposed in a 1:1 manner in the first direction DR1.

The pixel PX may include: a plurality of first contact electrodes CTE1 disposed on the first branch parts E1_2 of the first electrode E1; and a plurality of second contact electrodes CTE2 disposed on the second branch parts E2_2 of the second electrode E2.

With respect to the first direction DR1, the width of each of the first contact electrodes CTE1 may be larger than the width of each of the first branch parts E1_2. The first contact electrodes CTE1 may cover ends of the first branch parts E1_2. With respect to the first direction DR1, the width of each of the second contact electrodes CTE2 may be larger than the width of each of the second branch parts E2_2. The second contact electrodes CTE2 may cover ends of the second branch parts E2_2.

On the first and second electrodes E1 and E2, a plurality of first sub-insulating layers SIL1 may be disposed which extend in the first direction DR1 and are arranged in the second direction DR2. The first sub-insulating layers SIL1 may be disposed on the first branch parts E1_2 and the second branch parts E2_2. The first sub-insulating layers SIL1 may be arranged at regular intervals in the second direction DR2.

The pixel may include a plurality of light emitting elements ED. The light emitting elements ED may extend in the first direction DR1 and be disposed between the first sub-insulating layers SIL1. The light emitting elements ED may be horizontally arranged and both ends of the light emitting elements ED may be disposed on the first electrode E1 and the second electrode E2. The light emitting elements ED may be electrically connected to the first branch parts E1_2 of the first electrode E1 and the second branch parts E2_2 of the second electrode E2.

A planar region of the pixel PX may include a pixel region PA and a non-pixel region NPA around the pixel region PA. The light emitting elements ED may be disposed in the pixel region PA.

Figure 5:
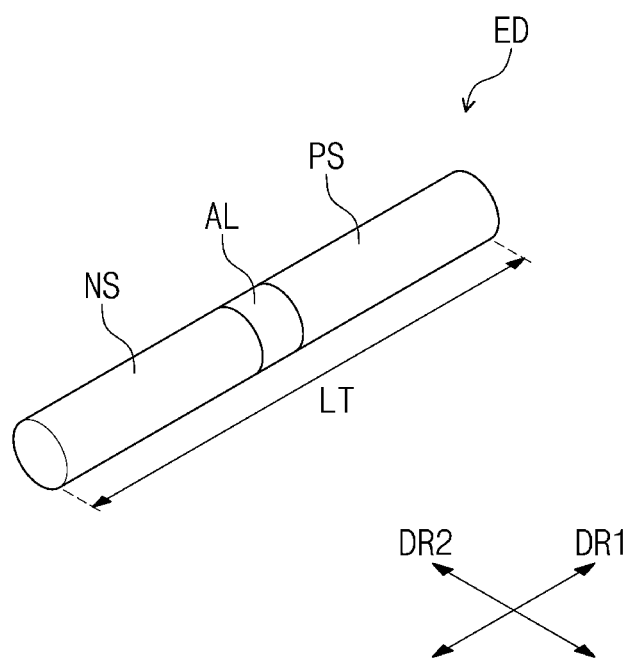
FIG. 5 is a perspective view of one light emitting element illustrated in FIG. 4.

FIG. 5 is a perspective view of the single light emitting element illustrated in FIG. 4.

FIG. 5 exemplarily illustrates a single light emitting element ED, but other light emitting elements ED may have the same configuration as the light emitting element ED illustrated in FIG. 5.

Referring to FIG. 5, a light emitting element ED may have a cylindrical shape extending in the first direction DR1. However, the present inventive concept is not limited thereto, and the light emitting element ED may also have a polygonal column shape. The light emitting element may include: an n-type semiconductor layer NS, a p-type semi-conductor layer PS, an active layer AL disposed between the n-type semiconductor layer NS and the p-type semiconductor layer PS.

The n-type semiconductor layer NS may be formed such that an n-type dopant is doped on to a semiconductor layer. The p-type semiconductor layer PS may be formed such that a p-type dopant is doped on to a semiconductor layer. The semiconductor layer may include a semiconductor material. For example, the semiconductor layer may include, but is not limited to, GaN, AN, AlGaN, InGaN, InN, InAlGaN, or AlInN.

The n-type dopant may be, but is not limited to, silicon (Si), germanium (Ge), tin (Sn), selenium (Se), tellurium (Te) or a combination thereof. The p-type dopant may be, but is not limited to, magnesium (Mg), zinc (Zn), strontium (Sr), barium (Ba) or a combination thereof.

The active layer AL may be formed in at least any one among a single quantum well structure, a multiple quantum well structure, a quantum line structure, or a quantum point structure. The active layer AL may be a region in which electrons injected through the n-type semiconductor layer NS and holes injected through the p-type semiconductor layer PS are recombined. The active layer AL may be defined as a layer which emits light having energy determined by an energy band inherent in a material. The position of the active layer AL may be variously changed according to the types of diodes.

The n-type semiconductor layer NS may be connected to any one of the first electrode E1 and the second electrode E2. The p-type semiconductor layer PS may be connected to the other of the first electrode E1 and the second electrode E2.

The length LT of the light emitting element ED may be several nanometers to several hundred micrometers. For example, the length LT of the light emitting element ED may be about 1 micrometer to about 100 micrometers.

Figure 6:
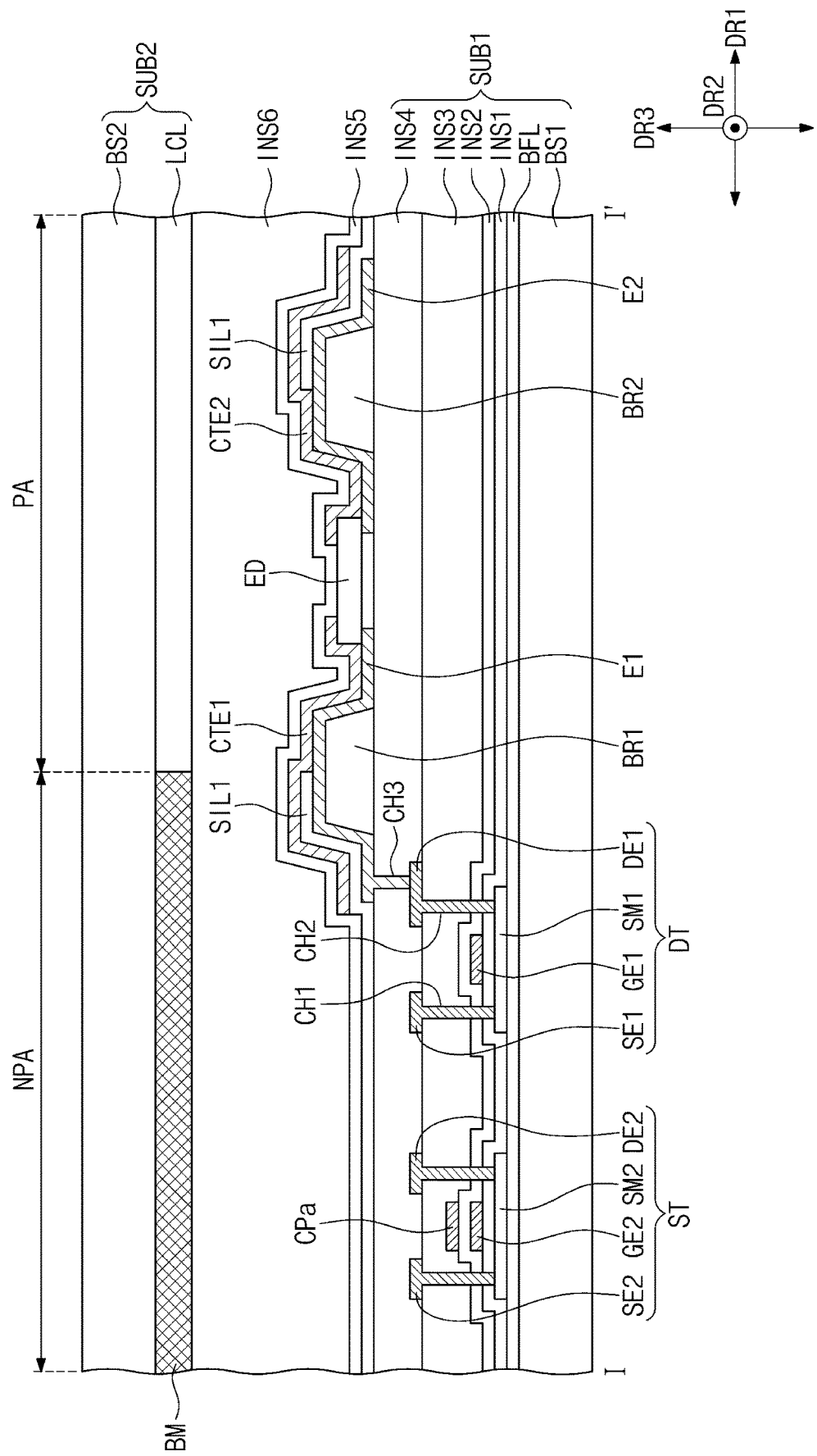
FIG. 6 is a cross-sectional view taken along line I-I' shown in FIG. 4.

FIG. 6 is a cross-sectional view taken along line I-I' shown in FIG. 4.

Referring to FIG. 6, the pixel PX may include a drive element DT, a switching element ST, a first electrode E1, a second electrode E2, and a light emitting element ED. The drive element DT, the switching element ST, the first electrode E1, the second electrode E2, and the light emitting element ED may be disposed on a first base substrate BS1.

A second base substrate BS2 may face the first base substrate BS1. The drive element DT, the switching element ST, the first electrode E1, the second electrode E2, and the light emitting element ED may be disposed between the first base substrate BS1 and the second base substrate BS2. The first and second base substrates BS1 and BS2 may each be a laminate structure including a silicon substrate, a plastic substrate, a glass substrate, an insulating film, or a plurality of insulating layers.

Since the configuration of the drive element DT and the configuration of the switching element ST are the same, the configuration of the drive element DT will hereinafter be mainly described, and the configuration of the switching element ST will be simply described or omitted.

A buffer layer BFL may be disposed on the first base substrate BS1. The buffer layer BFL may include an inorganic material. The drive element DT and the switching element ST may be disposed on the buffer layer BFL.

The drive element DT may include a first gate electrode GE1, a first source electrode SE1, a first drain electrode DE1, and a first semiconductor layer SM1. The switching element ST may include a second gate electrode GE2, a second source electrode SE2, a second drain electrode DE2, and a second semiconductor layer SM2.

The second gate electrode GE2, the second source electrode SE2, the second drain electrode DE2, and the second semiconductor layer SM2 may have the same structure as and be disposed on the same layer as the first gate electrode GE1, the first source electrode SE1, the first drain electrode DE1, and the first semiconductor layer SM1.

The first semiconductor layer SM1 may be disposed on the buffer layer BFL. The first semiconductor layer SM1 may include a semiconductor formed of an inorganic material, such as amorphous silicon or polysilicon, or an organic semiconductor. In addition, the first semiconductor layer SM1 may include an oxide semiconductor. Although not shown in FIG. 6, the first semiconductor layer SM1 may include a source region, a drain region, and a channel region between the source region and the drain region.

The buffer layer BFL may provide the first semiconductor layer SM1 with a modified surface. In this case, the first semiconductor layer SM1 may have higher adhesiveness to the buffer layer BFL than in the case of being directly disposed on the first base substrate BS1. The buffer layer BFL may be a barrier layer which protects the lower surface of the first semiconductor layer SM1. In this case, the buffer layer BFL may prevent contaminants or moisture in the first base substrate BS1 itself or introduced through the first base substrate BS1 from penetrating into the first semiconductor layer SM1.

A first insulating layer INS1 may be disposed on the buffer layer BFL so as to cover the first semiconductor SM1. The first insulation layer INS1 may include an inorganic material. For example, the first insulating layer INS1 may contain, but is not limited to containing, silicon nitride, silicon oxy nitride, silicon oxide, titanium oxide, or aluminum oxide.

The first gate electrode GE1 overlapping the first semiconductor layer SM1 may be disposed on the first insulating layer INS1. The first gate electrode GE1 may be disposed so as to overlap the channel region of the first semiconductor layer SM1. A second insulating layer INS2 may be disposed on the first insulating layer INS1 so as to cover the first gate electrode GE1. The second insulation layer INS2 may include an organic material.

A capacitive element C (shown in FIG. 2) may include a first cap electrode (not shown) and a second cap electrode CPa. The first cap electrode may branch from the second gate electrode GE2, and the second cap electrode CPa may be disposed on the second insulating layer INS2.

A third insulating layer INS3 may be disposed on the second insulating layer INS2 so at to cover the second cap electrode CPa. The third insulation layer INS3 may be defined as an interlayer insulating layer. The third insulating layer INS3 may contain an organic and/or an inorganic material.

The first source electrode SE1 and the first drain electrode DE1 may be disposed on the third insulating layer INS3 so as to be spaced apart from each other. The first source electrode SE1 may be connected to the source region of the first semiconductor layer SM1 through a first contact hole CH1 defined to pass through the first, second and third insulating layers INS1, INS2, and INS3. The first drain electrode DE1 may be connected to the drain region of the first semiconductor layer SM1 through a second contact hole CH2 defined to pass through the first, second and third insulating layers INS1, INS2, and INS3.

A fourth insulating layer INS4 may be disposed on the third insulating layer INS3 so as to cover the first source electrode SE1 and the first drain electrode DEL The fourth insulating layer INS4 may be defined as a flattened film, which provides a flat upper surface, and may contain an organic material.

A layer, in which the first base substrate BS1, the buffer layer BFL, and the first to fourth insulating layers INS1 to INS4 are disposed, may be defined as a first substrate SUB1. A first partition wall layer BR1 and a second partition wall layer BR2 may be disposed on the first substrate SUB1 so as to be spaced apart from each other. The first and second partition wall layers BR1 and BR2 may include an organic material.

The first electrode E1 may be disposed on the first substrate SUB1 so as to cover the first partition wall layer BR1. The first electrode E1 may be disposed on the first partition wall layer BR1, and may be disposed on a portion of the first substrate SUB1 adjacent to the first partition wall layer BR1. Accordingly, the first partition wall layer BR1 may be disposed between the first substrate SUB1 and the first electrode E1.

The second electrode E2 may be disposed on the first substrate SUB1 so as to cover the second partition wall layer BR2, and the second electrode E2 may be spaced apart from the first electrode E1. The second electrode E2 may be disposed on the second partition wall layer BR2, and may be disposed on a portion of the first substrate SUB1 adjacent to the second partition wall layer BR2. Accordingly, the second partition wall layer BR2 may be disposed between the first substrate SUB1 and the second electrode E2.

The first electrode E1 may be connected to the first drain electrode DE1 through a third contact hole CH3 defined to pass through the fourth insulating layer INS4 of the first substrate SUB1. Accordingly, the first electrode E1 may be electrically connected to the drive element DT.

Each of the first and second electrodes E1 and E2 may have a single layer or a plurality of laminate structures. For example, each of the first and second electrodes E1 and E2 may include a reflective electrode, or include a reflective electrode and a transparent electrode disposed on the reflective electrode.

The reflective electrode may contain copper (Cu), aluminum (Al), silver (Ag), or the like which may reflect light. The transparent electrode may contain at least any one among indium zinc oxide (IZO), indium tin oxide (ITO), indium gallium oxide (IGO), indium zinc gallium oxide (IGZO), or a mixture/compound thereof.

The light emitting element ED may be disposed between the first partition wall layer BR1 and the second partition wall layer BR2. Both sides of the light emitting element ED may be disposed on the first electrode E1 and the second electrode E2 and contact each of the first electrode E1 and the second electrode E2. The light emitting element ED may be electrically connected to the first and second electrodes E1 and E2.

The first sub-insulating layer SIL1 may extend in the first direction DR1 and be disposed on a first substrate SUB1, a predetermined portion of the first electrode E1, and a predetermined portion of the second electrode E2.

The first contact electrode CTE1 may be disposed on the first electrode E1 and a portion of the first sub-insulating layer SIL1 overlapping the first electrode E1, and cover one side of the light emitting element ED. The second contact electrode CTE2 may be disposed on the second electrode E2 and a portion of the first sub-insulating layer SIL1 overlapping the second electrode E2, and cover the other side of the light emitting element ED.

The first and second contact electrodes CTE1 and CTE2 may include a transparent conductive material. For example, the first and second contact electrodes CTE1 and CTE2 may include at least any one among indium zinc oxide (IZO), indium tin oxide (ITO), indium gallium oxide (IGO), indium zinc gallium oxide (IGZO), or a mixture/compound thereof, but the present inventive concept is not limited thereto.

The light emitting element ED may have a circular cylindrical shape, and since the side surface (or outer circumferential surface) of the circular cylindrical shape contacts the first and second electrodes E1 and E2, the light emitting element ED may come into line contact with the first and second electrodes E1 and E2. The line contact has a smaller contact area than surface contact, and the smaller the contact area, the larger the contact resistance may be. The resistance may interfere with the flow of current.

The first and second contact electrodes CTE1 And CTE2 cover both sides of the light emitting element ED and come into contact with the first and second electrodes E1 and E2, so that the contact area of the light emitting element ED may be increased by the first and second contact electrodes CTE1 And CTE2. Accordingly, contact resistance between the light emitting element ED and the first and second 1 electrodes E1 and E2 may be decreased.

A fifth insulating layer INS5 may be disposed on the first substrate SUB1 so as to cover the light emitting element ED and the first and second contact electrodes CTE1 and CTE2. The fifth insulating layer INS5 may include an inorganic material.

A light conversion layer LCL and a black matrix BM may be disposed on one surface of the second base substrate BS2 facing the first base substrate BS1. The light conversion layer LCL may be disposed in the pixel region PA and the black matrix may be disposed in the non-pixel region NPA. A portion of the pixels PX may not include the light conversion layer LCL.

The light conversion layer LCL may include an emissive body. For example, the emissive body may convert the wavelength of a first color light generated from the light emitting element ED and emit second light having different color from the first color light. The emissive body may be a quantum dot. The first color light may be blue light, and the second color light may be red light or green light.

Pixels including the light conversion layer LCL which converts blue light into red light, pixels including the light conversion layer LCL which converts blue light into green light, and pixels which do not include the light conversion layer LCL may be disposed on the display panel DP. Thus, red, blue, and green light may be generated by the pixels PX.

However, the present inventive concept is not limited thereto. For example, the light conversion layer LCL may be replaced by a color filter. In addition, the light conversion layer LCL may be omitted from the pixels PX. In this case, the light emitting element ED may emit blue, green, or red light. The black matrix BM may prevent light leak between pixels.

A layer, in which the second base substrate BS2, the light conversion layer LCL, and the black matrix BM are disposed, may be defined as the second substrate SUB2. A sixth insulating layer INS6 may be disposed between the first substrate SUB1 and the second substrate SUB2. The sixth insulating layer INS6 may be an optically clear adhesive film, an optically clear adhesive resin, or a pressure sensitive adhesive film.

The second substrate SUB2 may be attached to the first substrate SUB1 by the sixth insulating layer INS6. However, this is illustrated as merely an example, and in another embodiment of the inventive concept, the second substrate SUB2 and the sixth insulating layer INS6 may be omitted.

Figure 7:
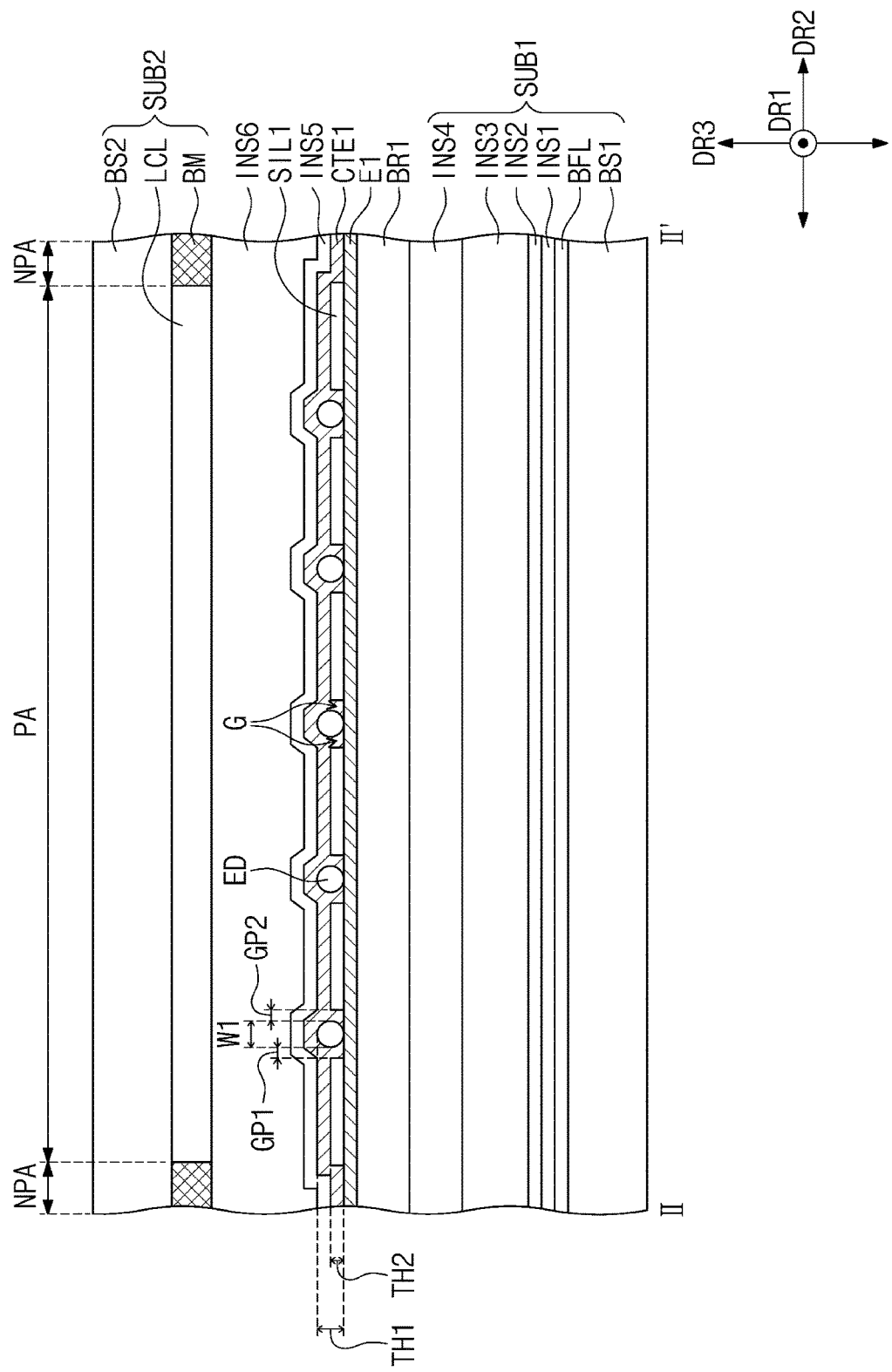
FIG. 7 is a cross-sectional view taken along line II-II' shown in FIG. 4.

FIG. 7 is a cross-sectional view taken along line II-IF of FIG. 4.

Referring to FIG. 7, the first sub-insulating layers SIL1 are disposed on the first electrode E1, and the first sub-insulating layers SIL1 may be disposed at regular intervals so as to be spaced apart from each other. Although not shown, the first sub-insulating layers SIL1 may be disposed on the second electrode E2 at regular intervals so as to be spaced apart from each other.

The first sub-insulating layers SIL1 may be inorganic insulating layers including inorganic materials. For example, the first sub-insulating layers SIL1 may include silicon nitride, silicon oxy nitride, silicon oxide, titanium oxide, or aluminum oxide.

With respect to the third direction DR3, the light emitting element ED may have a first thickness TH1, and each of the first sub-insulating layers SIL1 may have a second thickness TH2 smaller than the first thickness TH1. Here, the thickness may be defined as the distance, between the lower surface and the upper surface of the corresponding configuration, measured in the third direction DR3.

The second thickness TH2 may exemplarily be about 0.3-0.5 times the first thickness TH1, and may favorably be a value of about 0.5 times the first thickness TH1. With respect to the upper surface of the first electrode E1, the height of the upper surface of each first sub-insulating layer SIL1 may be lower than or equal to about 0.5 times the height of the upper end of each light emitting element ED.

With respect to the second direction DR2, each of the light emitting elements ED may have a first width W1. Here, the width may be defined as the gap between both ends of the corresponding configuration.

h-th light emitting element ED may be disposed between the h-th first sub-insulating layer SIL1 and the (h+1)-th first sub-insulating layer SIL1. With respect to the second direction, a first gap GP1 between the h-th first sub-insulating layer SIL1 and the h-th light emitting element ED and a second gap GP2 between the (h+1)-th first sub-insulating layer SIL1 and h-th light emitting element ED may be smaller than the first width W1. h is an integer, e.g., a whole number.

The first gap GP1 may be equal to the second gap GP2. For example, each of the first and second gaps GP1 and GP2 may have about 0.15 to about 0.25 times the first width W1, and may favorably have about 0.2 times the first width W1. It has been described that the first gap GP1 and the second gap GP2 are the same, but the present inventive concept is not limited thereto, and the first gap GP1 and the second gap GP2 may be different.

After the light emitting elements are disposed without disposing the first sub-insulating layers SIL1, the first contact electrode CTE1 may be disposed on the first electrode E1 so as to cover the light emitting elements ED. However, in this case, since the light emitting elements ED have circular cylindrical shapes, a conductive material for forming the first contact electrode CTE1 may not be normally supplied to the lower portion of each of the light emitting elements ED.

However, in an embodiment of the inventive concept, the first contact electrode CTE1 may be disposed in a space defined between the first sub-insulating layers SILL. Specifically, the conductive material for forming the first contact electrode CTE1 may be supplied to spaces G (hereinafter referred to as grooves) defined between the light emitting elements ED and the first sub-insulating layers SILL. Portions of the light emitting elements ED disposed in the grooves G may be defined as lower portions of the light emitting elements ED.

The conductive material may be supplied to the grooves G more intensively when supplied to the grooves than when supplied on to a plane. Accordingly, the first contact electrode CTE1 may be formed so as to further come into contact with the light emitting elements ED in the grooves G. Although not shown, the second contact electrode CTE2 may also be formed so as to further come into contact with the light emitting elements ED in the grooves G. Consequently, the contact areas of the light emitting elements ED against the first and second contact electrodes CTE1 and CTE2 may increase.

FIGS. 8 to 16 are views for describing a method for manufacturing a display device according to an embodiment of the inventive concept.

Figure 10:
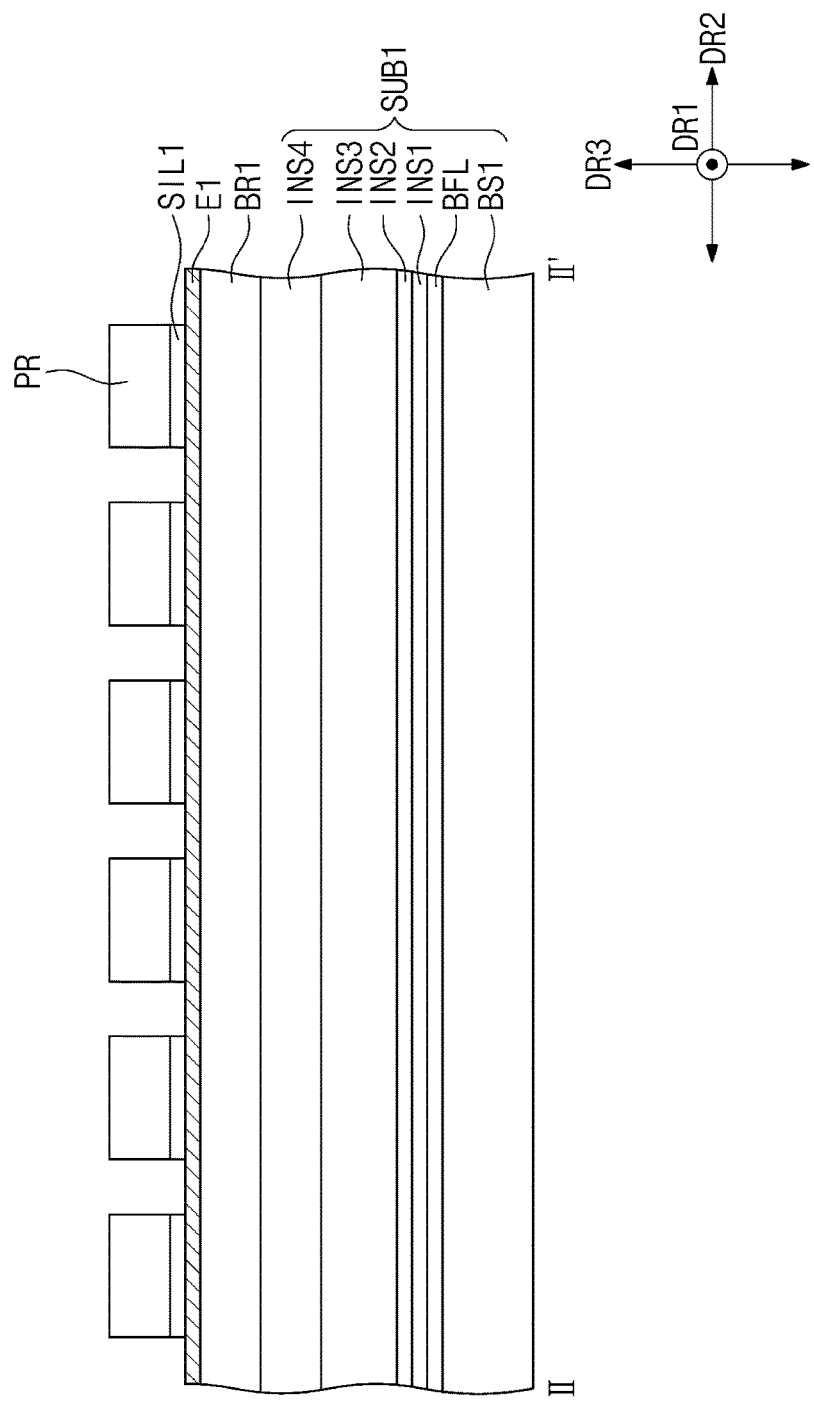
Figure 11:
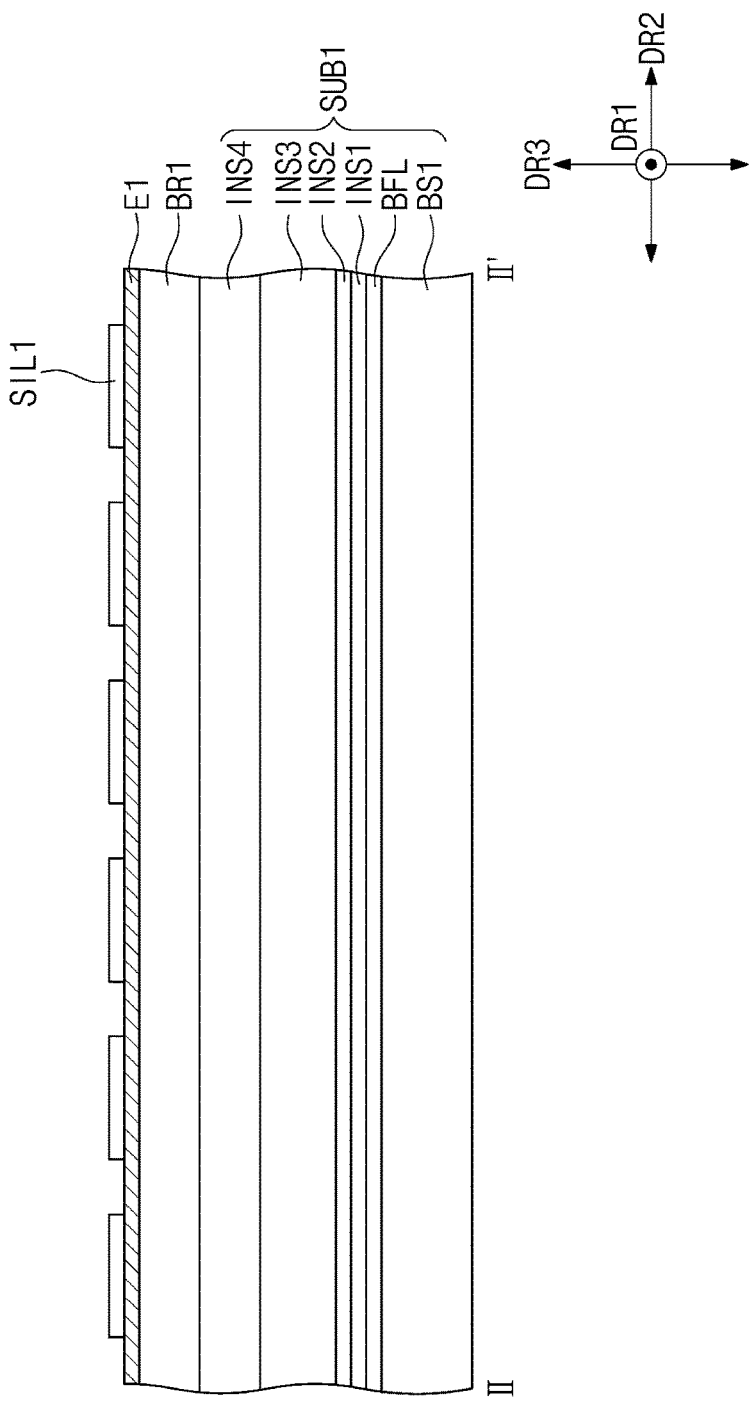
Figure 12:
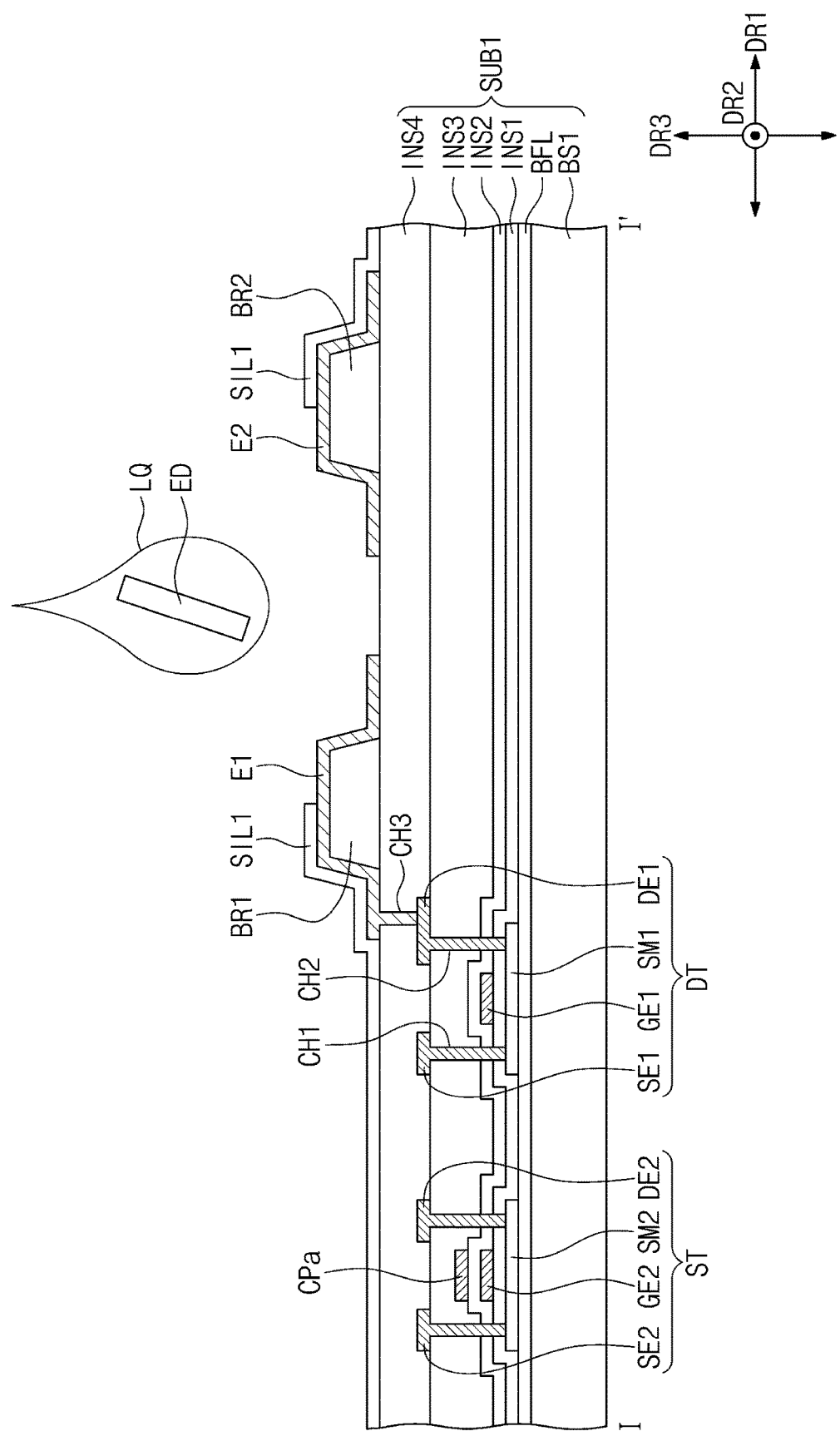
Figure 13:
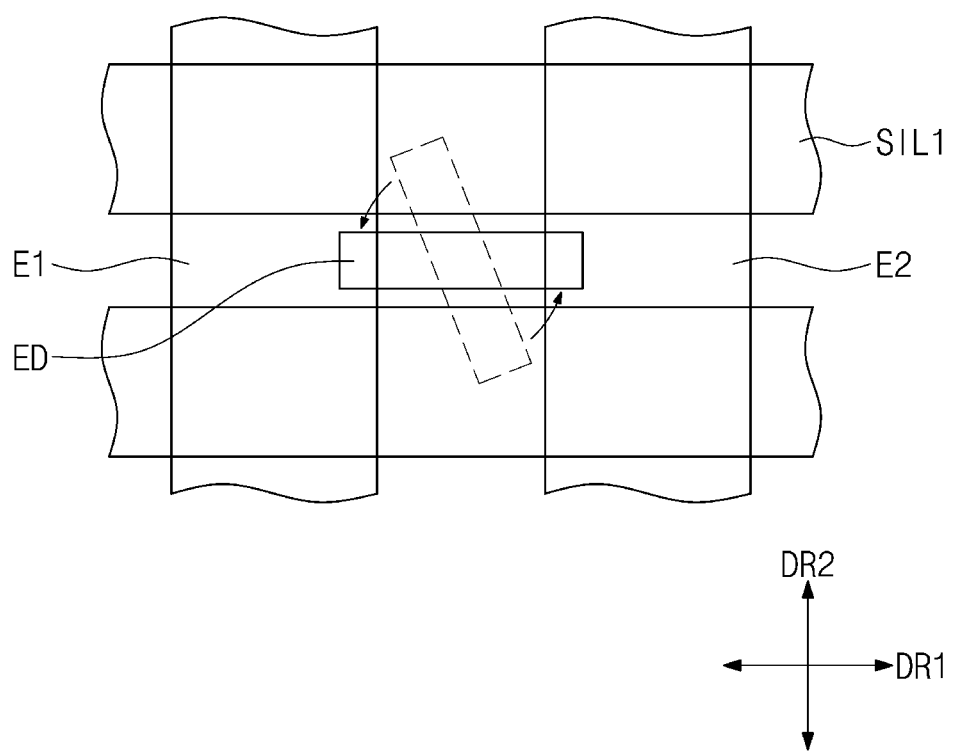
Figure 14:
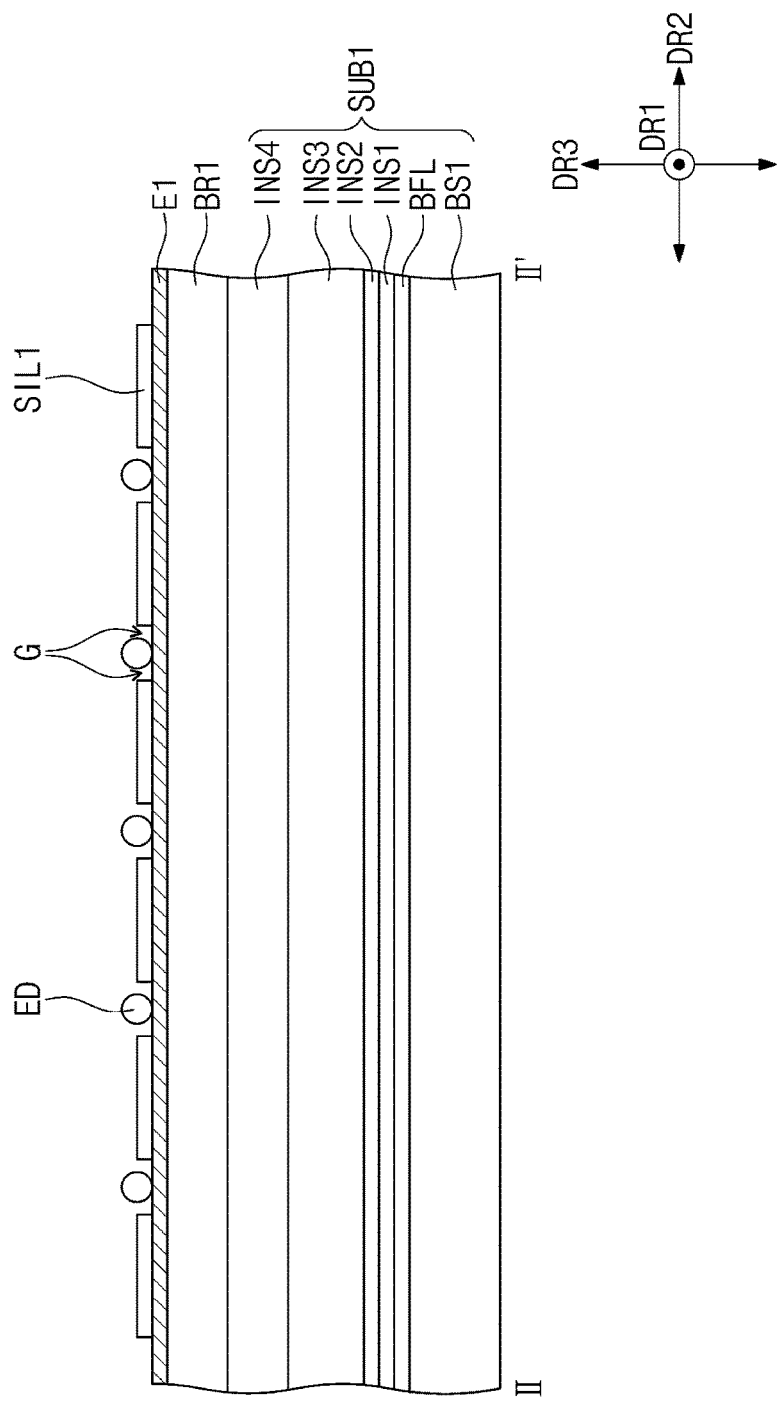
Figure 15:
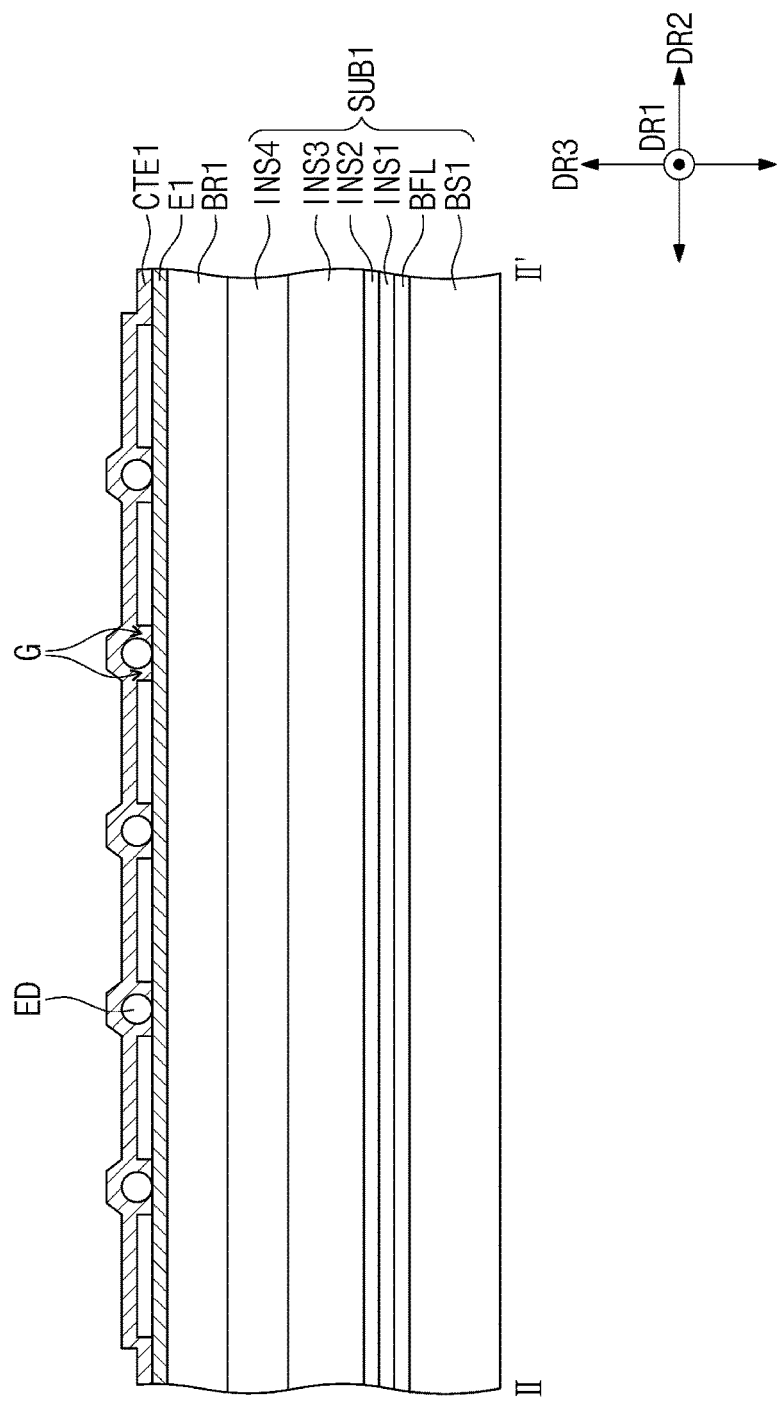
Figure 16:
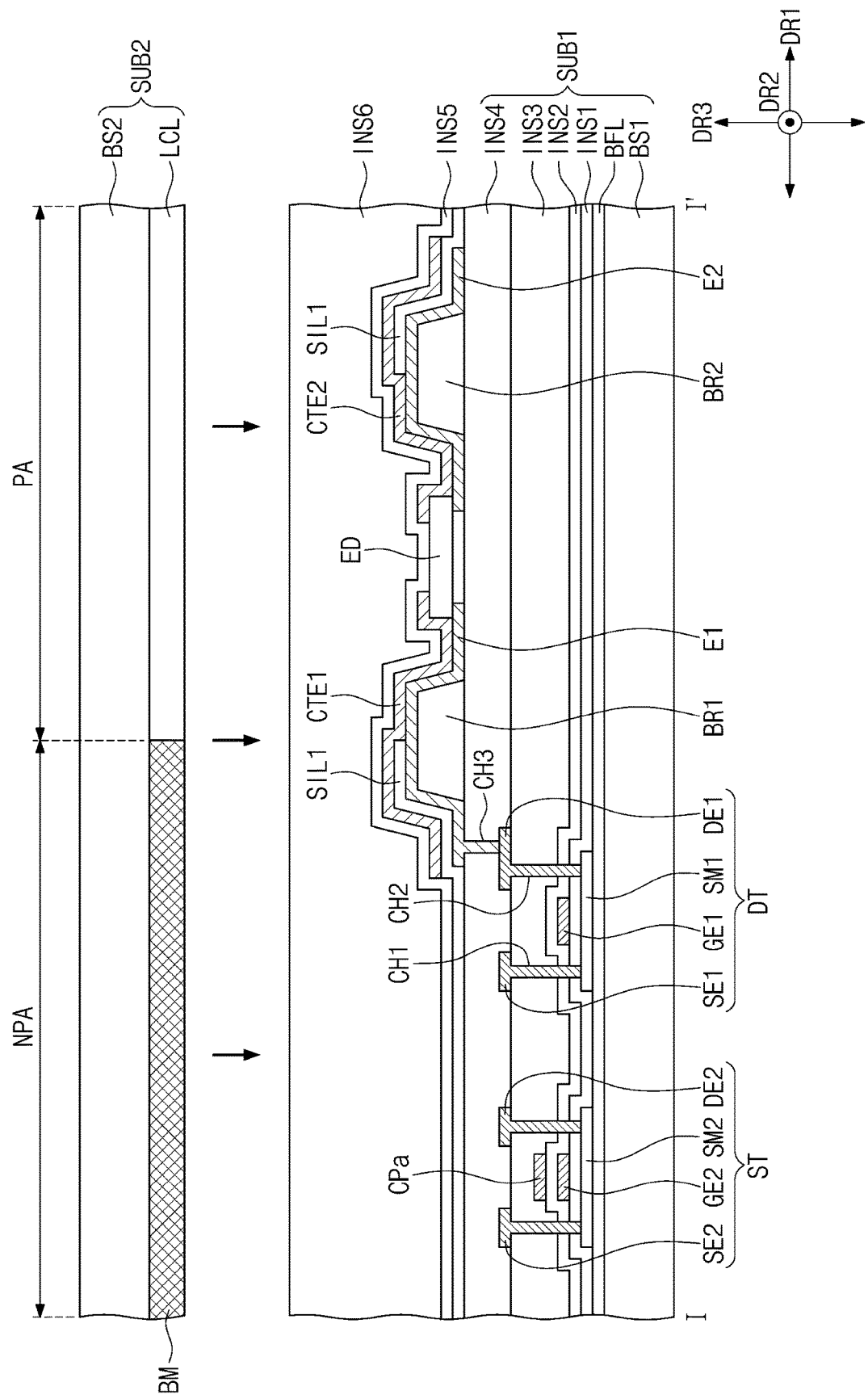

For convenience of description, FIGS. 8 to 11, 14 and 15 are illustrated as cross-sectional surfaces corresponding to FIG. 7, and FIGS. 12 and 16 are illustrated as cross-sectional surface corresponding to FIG. 6. In addition, FIG. 13 illustrates a plane of first and second electrodes E1 and E2 on which a single light emitting element ED is disposed.

Hereinafter as an example, referring to FIGS. 8 to 11, a method for forming first sub-insulating layers SIL1 disposed on a first electrode E1 will be described. Although not shown, first sub-insulating layers SIL1 disposed on second electrode E2 may substantially be formed by the same method as the manufacturing method illustrated in FIGS. 8 to 11.

Figure 8:
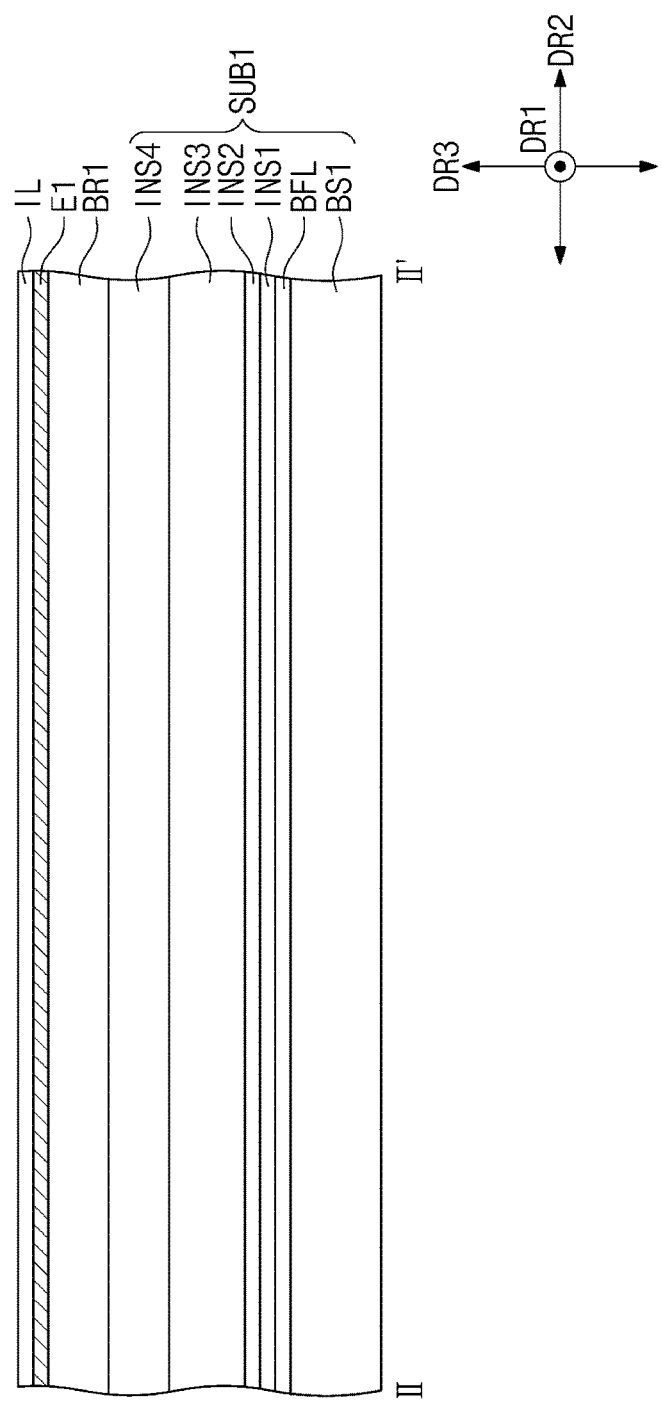
FIGS. 8, 9, 10, 11, 12, 13, 14, 15, and 16 are views for describing a method for manufacturing a display device according to an embodiment of the inventive concept.

Referring to FIG. 8, a first partition wall layer BR1 is provided on a first substrate SUB1, a first electrode E1 is provided on the first partition wall layer BR1, and an insulating layer IL may be provided on the first electrode E1. The insulating layer IL is an inorganic layer including an inorganic material, and may be provided on the first substrate SUB1 to form first sub-insulating layers SIL1.

Although not shown, a second electrode E2 may be provided on a second partition wall layer BR2, and an insulating layer IL may be provided on the second electrode E2.

Figure 9:
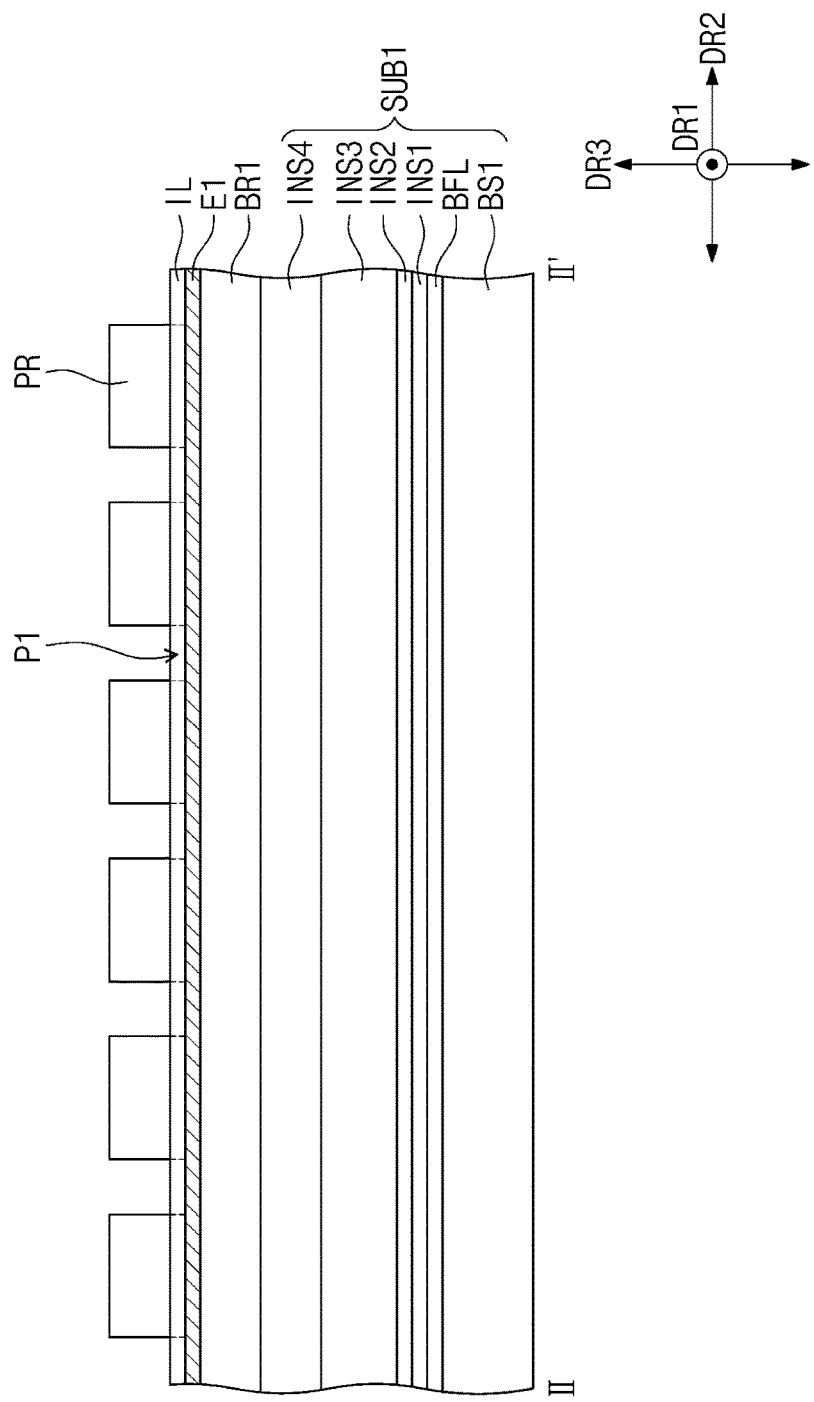

Referring to FIG. 9, a photoresist pattern PR which exposes first portions P1 of the insulating layer IL may be provided on the insulating layer IL. The photoresist pattern PR may include a photosensitive resin.

Portions overlapping the photoresist pattern PR may be the portions for substantially forming the first sub-insulating layers SIL1 The first portions P1 may extend in a first direction DR1 and be arranged in a second direction DR2.

Referring to FIG. 10, the first portions P1 exposed by the photoresist pattern PR may be removed with the photoresist pattern PR serving as a mask. For example, in order to remove the first portions P1, a dry etching method may be used.

Referring to FIG. 11, the photoresist pattern PR is removed, and the first sub-insulating layers SIL1 may be formed by the remaining insulating layer IL. The first sub-insulating layers SIL1 may be arranged at regular intervals on the first electrode E1. Although not shown, the first sub-insulating layers SIL1 may also be disposed on the second electrode E2.

Referring to FIG. 12, a solution LQ including a light emitting element ED may be provided between the first partition wall layer BR1 and the second partition wall layer BR2. The solution LQ may be an ink or a paste. The solution LQ may be a material which can be gasified at the room temperature or gasified by heat.

Referring to FIG. 13, voltages having polarities opposite to each other may be applied to the first electrode E1 and the second electrode E2. A direct current voltage or an alternating current voltage may be applied to the first electrode E1 and the second electrode E2. Accordingly, an electric field may be formed between the first electrode E1 and the second electrode E2. Dipolarity may be induced by the electric field in the light emitting element ED, and the light emitting element ED may be self aligned on to the first electrode E1 and the second electrode E2 by a dielectrophoresis force.

Since the first sub-insulating layers SIL1 are insulating materials, a stronger electric field may be formed at the first electrode E1 and the second electrode E2 between the first sub-insulating layers SIL1 than in the region in which the first sub-insulating layers SIL1 are disposed. Accordingly, the light emitting element ED may easily be aligned toward the first electrode E1 and the second electrode E2 between the first sub-insulating layers SIL1. Consequently, the degree of alignment of the light emitting element ED may be improved.

Referring to FIG. 14, the light emitting elements ED may be aligned by the electric field and be disposed between the first sub-insulating layers SILL As described above, grooves G may be defined between the light emitting elements ED and the first sub-insulating layers SILL Referring to FIG. 15, a first contact electrode CTE1 may be provided on the first electrode E1 so as to cover the light emitting elements ED in the grooves G. The first contact electrodes CTE1 may be provided on the first sub-insulating layers SILL In order to form the first contact layer CTE1, a conductive material may be provided on the first substrate SUB1 and the conductive materials may be more intensively provided to the grooves G.

The first contact electrode CTE1 may be formed so as to further come into contact with the lower portions of the light emitting elements ED disposed in the grooves G. Accordingly, the contact areas of the light emitting elements ED against the first contact electrode CTE1 may be increased. Although not shown, a second contact electrode CTE2 is disposed in the grooves G, so that the contact areas of the light emitting elements ED against the second contact electrode CTE2 may be increased.

Referring to FIG. 16, a fifth insulating layer INS5 may be disposed on the first substrate SUB1 so as to cover the first and second contact electrodes CTE1 and CTE2, the light emitting element ED, and the first sub-insulating layers SILL A sixth insulating layer INS6 is provided on the fifth insulating layer INS5, and a second substrate SUB2 is provided on the sixth insulating layer INS6, and thus, a display device DD may be manufactured.

Consequently, a display device DD and a method for manufacturing the same may improve the degree of alignment and contact areas of light emitting elements ED.

Figure 17:
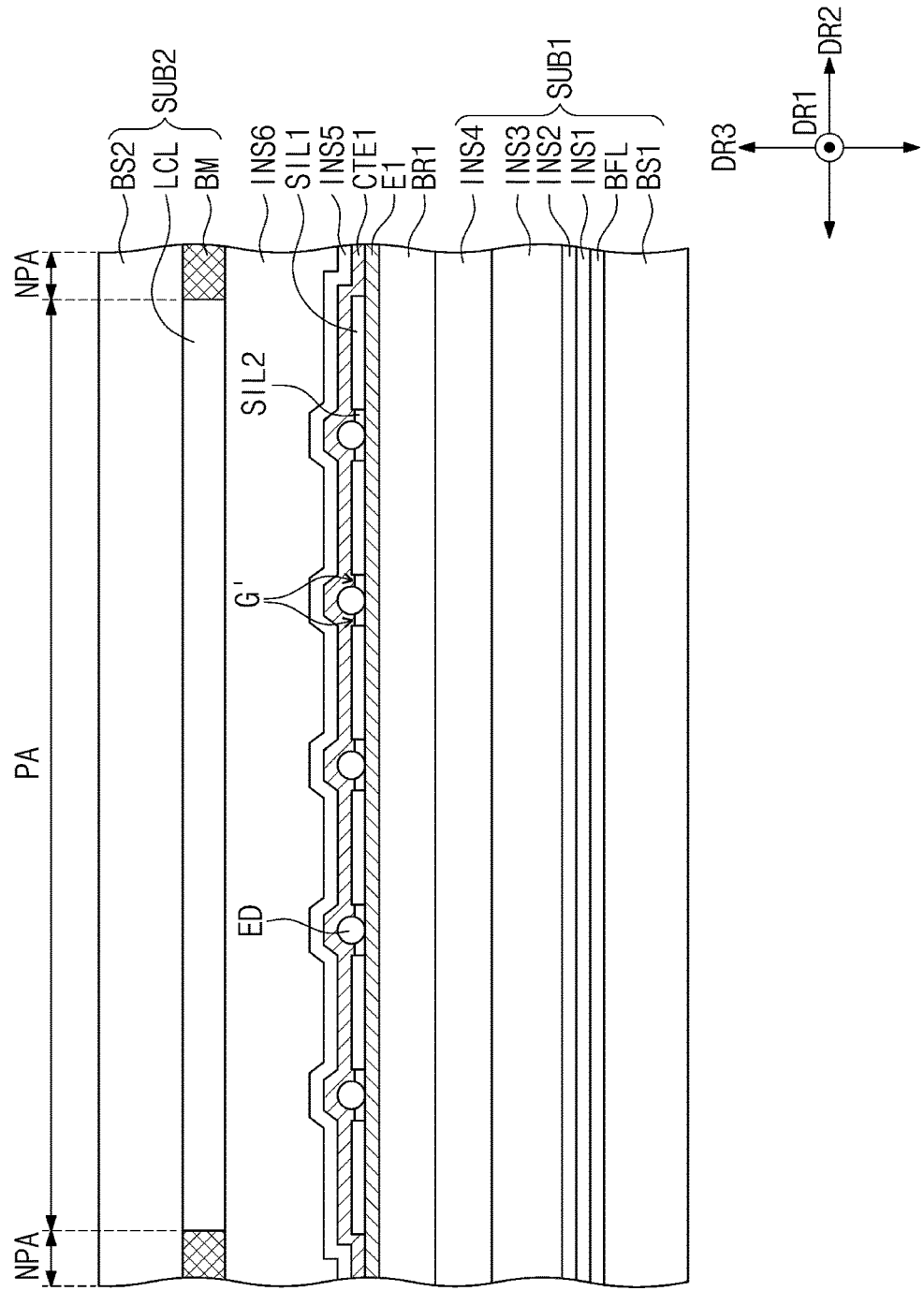
FIG. 17 is a view for illustrating a configuration of a display device according to another embodiment of the inventive concept.

FIG. 17 is a view for illustrating a configuration of a display device according to another embodiment of the inventive concept.

FIG. 17 exemplarily illustrates a cross-sectional surface corresponding to FIG. 7, and other then the fact that second sub-insulating layers SIL2 are added, other elements may substantially be the same as the configurations illustrated in FIG. 7. Accordingly, configuration of the second sub-insulating layers SIL2 will be hereinafter described, and descriptions about other configurations will be omitted.

Referring to FIG. 17, a plurality of second sub-insulating layers SIL2 may be disposed on a first electrode E1 between light emitting elements ED and first sub-insulating layers SILL With respect to a third direction DR3, the thickness of each of the second sub-insulating layers SIL2 may be smaller than the thickness of each of the first sub-insulating layers SIL1. For example, the second sub-insulating layers SIL2 may be organic insulating layers including organic materials.

The lower ends of the light emitting elements ED may not be exposed by the second sub-insulating layers SIL2. The light emitting elements ED may be more firmly fixed by the second sub-insulating layers SIL2.

Grooves G' may be defined on the second sub-insulating layers SIL2 between the light emitting elements ED and the first sub-insulating layers SIL1 and a conductive material for forming a first contact electrode CTE1 may intensively be provided to the grooves G'. A conductive material for forming a second contact electrode CTE2 may also be provided to the grooves G'. Consequently, the contact areas of the light emitting elements ED against the first and second contact electrodes CTE1 and CTE2 may be increased.

In an embodiment of the inventive concept, first sub-insulating layers are arranged on a first electrode and a second electrode, and light emitting elements are arranged between the first sub-insulating layers, so that the degree of alignment of the light emitting elements may be improved.

In addition, in an embodiment of the inventive concept, first and second contact electrodes are arranged in a space defined between first sub-insulating layers and cover light emitting elements, and thus, the contact areas of the light emitting elements against the first and second electrodes may be improved.

While exemplary embodiments are described above, a person skilled in the art may understand that many modifications and variations may be made without departing from the spirit and scope of the present invention defined in the following claims. Also, embodiments disclosed in the present disclosure are not intended to limit the technical spirit of the present invention and the following claims and all technical spirits falling within equivalent scope are construed as being included in the scope of rights of the present invention.

What is claimed is:

1. A display device comprising:
   a substrate;
   a first electrode disposed on the substrate;
   a second electrode disposed on the substrate and spaced apart from the first electrode;
   a plurality of first sub-insulating layers extending in a first direction, disposed on the substrate and on the first and second electrodes, and arranged in a second direction crossing the first direction; and
   a plurality of light emitting elements disposed between the first sub-insulating layers and electrically connected to the first electrode and the second electrode,
   wherein a light emitting element of the light emitting elements extends in the first direction,
   wherein a first end portion of the light emitting element is on the first electrode, and a second end portion of the light emitting element is on the second electrode, and
   wherein the plurality of light emitting elements does not overlap the plurality of first sub-insulating layer.

2. The display device of claim 1, wherein with respect to a third direction perpendicular to a plane defined by the first and second directions, each of the light emitting elements has a first thickness, and each of the first sub-insulating layers has a second thickness smaller than the first thickness.

3. The display device of claim 2, wherein the second thickness has a value of 0.3 times to 0.5 times the first thickness.

4. The display device of claim 1, wherein with respect to the second direction, the light emitting element has a first width, and a first gap between an h-th first sub-insulating layer and an h-th light emitting element of the light emitting elements and a second gap between an (h+1)-th first sub-insulating layer and the h-th light emitting element are smaller than the first width (h is a natural number).

5. The display device of claim 4, wherein each of the first and second gaps has a value of 0.15 times to 0.25 times the first width.

6. The display device of claim 1, wherein the first and second electrodes extend in the second direction.

7. The display device of claim 1, wherein the first sub-insulating layers are arranged at regular intervals in the second direction.

8. The display device of claim 1, further comprising:
   a first contact electrode extending in the second direction, disposed on the first electrode and on portions of the first sub-insulating layers overlapping the first electrode, and configured to cover one sides of the light emitting elements; and
   a second contact electrode extending in the second direction, disposed on the second electrode and on portions of the first sub-insulating layers overlapping the second electrode, and configured to cover the other sides of the light emitting elements.

9. The display device of claim 1, wherein the first sub-insulating layers comprise an inorganic material.

10. The display device of claim 1, further comprising:
    a first partition wall layer disposed between the substrate and the first electrode; and
    a second partition wall layer disposed between the substrate and the second electrode,
    wherein the light emitting elements are disposed between the first partition wall layer and the second partition wall layer.

11. The display device of claim 1, further comprising: a plurality of second sub-insulating layers disposed between the light emitting elements and the first sub-insulating layers, wherein with respect to a third direction crossing a plane defined by the first and second directions, a thickness of each of the second sub-insulating layers is smaller than a thickness of each of the first sub-insulating layers.

12. The display device of claim 11, wherein the second sub-insulating layers comprise an organic material.

13. The display device of claim 1, wherein the first electrode comprises a plurality of first branch parts extending in the second direction, and
    wherein the second electrode comprises a second branch part extending in the second direction and spaced apart from the first branch parts.

14. The display device of claim 13, wherein the first electrode further comprises a first extension part extending in the first direction and connected to the plurality of first branch parts and,
    wherein the second electrode further comprises a second extension part extending in the first direction and connected to the second branch part.

15. The display device of claim 1, wherein the light emitting element comprises a n-type semiconductor layer, a p-type semiconductor layer, and an active layer disposed between the n-type semiconductor layer and the p-type semiconductor layer, and
    wherein the n-type semiconductor layer, the active layer and the p-type semiconductor layer are disposed in the second direction.

* * * * *